United States Patent
Stowell et al.

(10) Patent No.: US 10,269,541 B2
(45) Date of Patent: Apr. 23, 2019

(54) WORKPIECE PROCESSING CHAMBER HAVING A THERMAL CONTROLLED MICROWAVE WINDOW

(71) Applicant: APPLIED MATERIALS, INC., Santa Clara, CA (US)

(72) Inventors: Michael W. Stowell, Loveland, CO (US); Qiwei Liang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 624 days.

(21) Appl. No.: 14/293,114

(22) Filed: Jun. 2, 2014

(65) Prior Publication Data

US 2015/0348757 A1 Dec. 3, 2015

(51) Int. Cl.
| | |
|---|---|
| C23C 16/00 | (2006.01) |
| C23F 1/00 | (2006.01) |
| H01L 21/306 | (2006.01) |
| H01J 37/32 | (2006.01) |

(52) U.S. Cl.
CPC .. *H01J 37/32229* (2013.01); *H01J 37/32238* (2013.01); *H01J 37/32449* (2013.01); *H01J 37/32522* (2013.01)

(58) Field of Classification Search
CPC .......... H01J 37/32449; H01J 37/32522; H01J 37/32192–37/32321; H05H 2001/4607; H05H 2001/4615; H05H 2001/4622; H05H 21/67069; H05H 1/46; H05H 2001/463; C23C 16/511
USPC ............ 118/723 MW, 724, 725; 156/345.41, 156/345.52, 345.53
See application file for complete search history.

(56) References Cited

U.S. PATENT DOCUMENTS

| | | | |
|---|---|---|---|
| 4,335,289 A | 6/1982 | Smith | |
| 4,546,225 A | 10/1985 | McCammon | |
| 4,613,836 A | 9/1986 | Evans | |
| 5,235,251 A | 8/1993 | Schlie | |
| 5,534,109 A | 7/1996 | Fujiwara et al. | |
| 5,844,195 A | 12/1998 | Fairbairn | |
| 6,110,556 A | 8/2000 | Bang | |
| 6,376,817 B1 | 4/2002 | McFadden | |
| 6,551,445 B1 | 4/2003 | Yokogawa et al. | |
| 6,688,375 B1* | 2/2004 | Turner | C23C 16/46 118/719 |
| 6,736,930 B1* | 5/2004 | Hongoh | H01J 37/32192 118/723 MW |
| 7,137,354 B2 | 11/2006 | Collins | |
| 7,695,567 B2 | 4/2010 | Fu | |

(Continued)

FOREIGN PATENT DOCUMENTS

| | | | |
|---|---|---|---|
| JP | 2010789731 | | 9/2010 |
| KR | 10-2011-0088471 | * | 9/2011 |

(Continued)

OTHER PUBLICATIONS

U.S. Appl. No. 14/293,123, filed Jun. 2, 2014, Stowell et al.

(Continued)

*Primary Examiner* — Rakesh K Dhingra
(74) *Attorney, Agent, or Firm* — Fish & Richardson P.C.

(57) ABSTRACT

A plasma reactor has a microwave source including a microwave window with a channel extending through the window and a coolant source for flowing a coolant through the channel. The coolant is a liquid that does not absorb microwave power.

19 Claims, 7 Drawing Sheets

(56) References Cited

U.S. PATENT DOCUMENTS

| | | |
|---|---|---|
| 7,967,996 B2 | 6/2011 | Collins et al. |
| 8,642,135 B2 | 2/2014 | Qin et al. |
| 8,796,131 B2 | 8/2014 | Jones et al. |
| 8,962,224 B2 | 2/2015 | Wu et al. |
| 2002/0046807 A1* | 4/2002 | Hongo .................. C23C 16/511 156/345.37 |
| 2002/0073922 A1 | 6/2002 | Frankel |
| 2002/0110998 A1* | 8/2002 | Ko ....................... C23C 16/402 438/484 |
| 2002/0164883 A1* | 11/2002 | Ohmi .................... C23C 16/511 438/726 |
| 2004/0050494 A1* | 3/2004 | Ohmi .................... C23C 16/511 156/345.41 |
| 2004/0166612 A1 | 8/2004 | Maydan et al. |
| 2005/0173422 A1 | 8/2005 | Kato et al. |
| 2007/0133919 A1 | 6/2007 | Ohmi et al. |
| 2010/0218722 A1* | 9/2010 | Vikharev ............... C23C 16/274 118/723 MW |
| 2010/0240225 A1 | 9/2010 | Sato |
| 2012/0098405 A1 | 4/2012 | Chen |
| 2012/0129358 A1* | 5/2012 | Ogawa ............. H01L 21/67109 438/795 |
| 2012/0222816 A1 | 9/2012 | Ikeda et al. |
| 2013/0284093 A1* | 10/2013 | Jang .................. H01J 37/32192 118/723 ME |
| 2014/0217895 A1* | 8/2014 | Busche ............. H01J 37/32522 315/117 |
| 2015/0279626 A1 | 10/2015 | Chen |
| 2015/0348757 A1 | 12/2015 | Stowell et al. |

FOREIGN PATENT DOCUMENTS

| | | |
|---|---|---|
| KR | 10-2013-017994 | * 10/2013 |
| KR | 101299702 | 10/2013 |

OTHER PUBLICATIONS

International Preliminary Report on Patentability in International Application No. PCT/US2015/030485, dated Dec. 15, 2016, 9 pages.

Office Action in U.S. Appl. No. 14/293,123, dated Jun. 15, 2016, 15 pages.

Office Action in U.S. Appl. No. 14/293,123, dated Apr. 29, 2016.

* cited by examiner

WORKPIECE PROCESSING CHAMBER HAVING A THERMAL CONTROLLED MICROWAVE WINDOW

BACKGROUND

Technical Field

The disclosure concerns a chamber or reactor for processing a workpiece such as a semiconductor wafer using microwave power.

Description of Related Art

Processing of a workpiece such as a semiconductor wafer can be carried out using a form of electromagnetic energy, such as RF power or microwave power, for example. The power may be employed, for example, to generate a plasma, for carrying out a plasma-based process such as plasma enhanced chemical vapor deposition (PECVD) or plasma enhanced reactive ion etching (PERIE). Some processes need extremely high plasma ion densities with extremely low plasma ion energies. This is true for processes such as deposition of diamond-like carbon (DLC) films, where the time required to deposit some type of DLC films can be on the order of hours, depending upon the desired thickness and upon the plasma ion density. A higher plasma density generally translates to a shorter deposition time.

A microwave source typically produces a very high plasma density while producing a plasma ion energy that is less than that of other sources (e.g., an inductively coupled RF plasma source or a capacitively coupled RF plasma source). For this reason, a microwave source would be most ideal. However, a microwave source cannot meet the stringent uniformity required for distribution across the workpiece of deposition rate or etch rate. The minimum uniformity may correspond to a variation across the workpiece of less than 1%. The microwave power is delivered into the chamber through a microwave antenna such as a waveguide having slots facing a dielectric window of the chamber. Microwaves are admitted into the chamber through the slots. The antenna has a periodic power deposition pattern reflecting the wave pattern of the microwave emission and the slot layout, rendering the process rate distribution non-uniform. This prevents attainment of the desired process rate uniformity across the workpiece.

A limitation on processing rate is the amount of microwave power that can be delivered to a process chamber without damaging the microwave window of the chamber. Currently, a microwave window, such as a quartz plate, can withstand only low microwave power levels at which DLC deposition processes can require hours to reach a desired DLC film thickness.

SUMMARY

A reactor for processing a workpiece comprises: (a) a chamber and a workpiece support in the chamber, the chamber comprising a ceiling and a side wall, the ceiling comprising a microwave transmissive window having a disk shape; (b) a first gas distribution plate overlying the workpiece support and comprising plural gas injection orifices, a process gas plenum overlying the first gas distribution plate and a process gas supply conduit coupled to the process gas plenum; (c) a microwave radiator overlying the microwave transmissive window and comprising a cylindrical hollow conductive housing having a top, a side wall and a bottom floor, an array of openings in the bottom floor, and a microwave input port; (d) a coolant channel extending along a radial plane through the microwave transmissive window; and (e) a coolant circulator coupled to the coolant channel.

In one embodiment, the reactor further comprises a microwave generator coupled to the microwave input port and having an output power level of 800 kW in continuous wave mode or 1 megaWatt in pulsed mode.

In one embodiment, the coolant circulator is connected across the channel. In a related embodiment, the coolant circulator comprises an inflow port coupled to a first portion of the coolant channel, and an outflow port coupled to a second portion of the coolant channel. In a further embodiment, the reactor further comprises: (a) a first arcuate array of radial inlets coupled to the first portion of the coolant channel, and a second arcuate array of radial inlets coupled to the second portion of the coolant channel; (b) first and second plenums coupled respectively to the first and second portions of the coolant channel, the inflow and outflow ports being connected to the first and second plenums respectively.

In one embodiment, the first portion of the coolant channel corresponds to a first circular half of the coolant channel and the second portion of the coolant channel corresponds to a second circular half of the coolant channel.

In an embodiment, the microwave transmissive window comprises a pair of parallel plates and the channel comprises a space between the pair of parallel plates.

In one embodiment, the reactor further comprises a second gas distribution plate underlying the first gas distribution plate and comprising second plural gas injection orifices, an underlying process gas plenum between the first and second gas distribution plates, and a second process gas supply conduit coupled to the second process gas plenum.

In one embodiment, the plasma reactor 1 further comprises a coolant medium supply coupled to an interior of the microwave radiator. In a related embodiment, the coolant medium supply is coupled to the microwave input port of the microwave radiator.

In one embodiment, the plasma reactor further comprises: (A) a rotary waveguide coupling comprising: (a) a stationary member fixed with respect to the chamber and comprising a microwave power receiving port, and (b) a rotatable member coupled to the microwave input port of the microwave radiator and having an axis of rotation coincident with an axis of symmetry of the cylindrical hollow conductive housing; and (B) a rotation actuator coupled to the rotatable member, whereby the microwave radiator is rotatable by the rotation actuator about the axis of symmetry.

In a related embodiment, the plasma reactor further comprises an axial waveguide connected between the microwave input port of the microwave radiator and the rotatable member. In one embodiment, the axial waveguide is coaxial with the axis of symmetry.

In one embodiment, the plasma reactor further comprises a microwave generator and a flexible waveguide conduit connected between the microwave generator and the microwave power receiving port of the stationary member.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

The problem of process non-uniformity attributable to the periodic power deposition pattern of the microwave antenna is solved in one embodiment by continuously rotating the microwave antenna relative to the workpiece. The rotation is performed during or contemporaneously with application of microwave power. The rotation may be about an axis of symmetry. This axis of symmetry may be the axis of symmetry of the process chamber, the workpiece and/or the antenna.

The problem of having to limit microwave power to avoid damaging the microwave window is solved by providing a channel through the window and flowing a coolant through the channel. In one embodiment, the coolant is a liquid that does not absorb microwave power (or absorbs very little). In one embodiment, the microwave window is provided as a pair of window layers separated by the channel.

An advantage of the microwave plasma source is that it efficiently generates plasma in a wide range of chamber pressures, generally from above atmospheric pressure down to $10^{-6}$ Torr or below. This enables its use across a very wide range of processing applications. In contrast, other plasma sources, such as inductively coupled plasma sources or capacitively coupled plasma sources, can only be used in much more narrow ranges of chamber pressures, and are therefore useful in correspondingly limited sets of processing applications.

Figure 1:
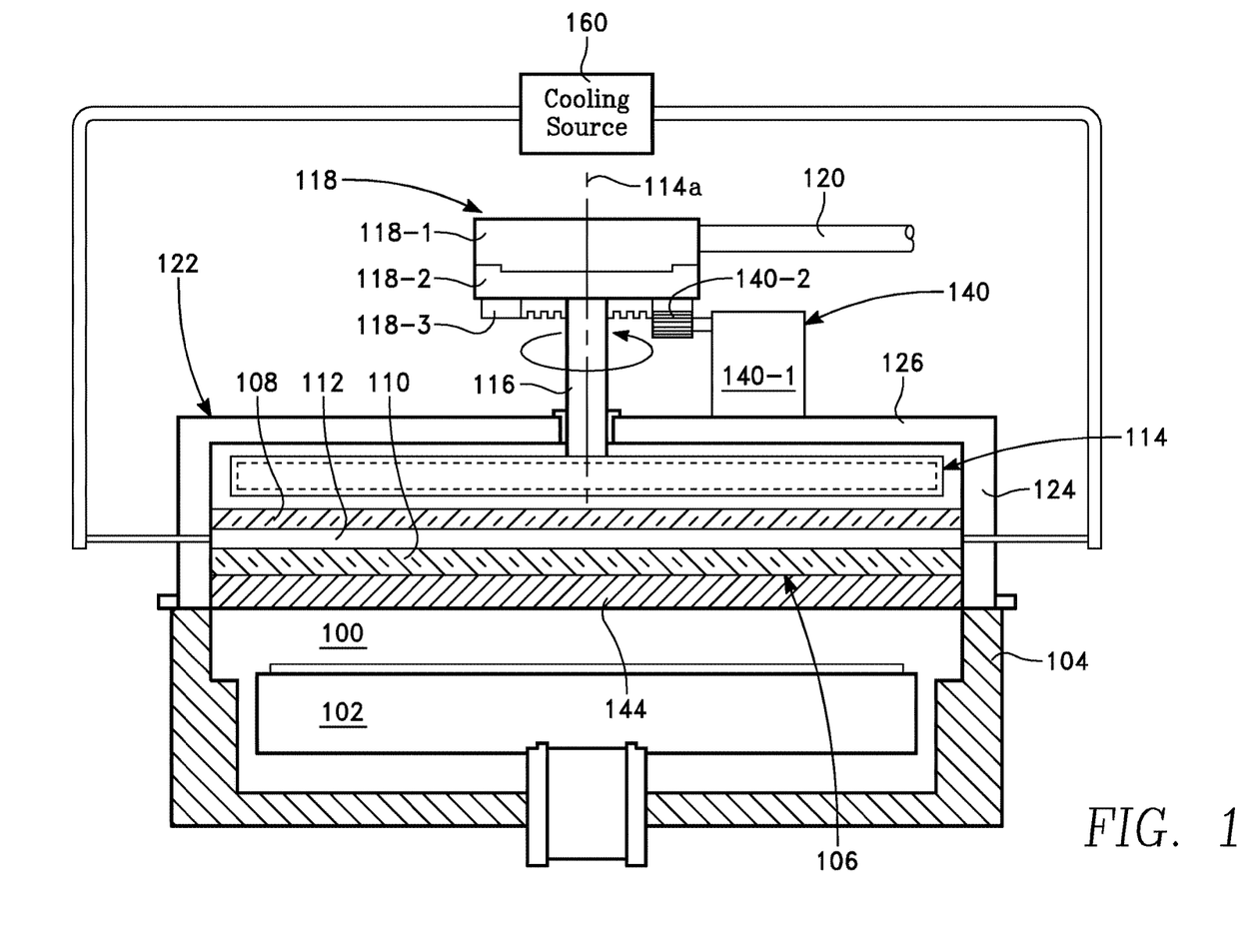
FIG. 1 is a cut-away elevational view of a first embodiment.

Rotating Microwave Source:

Referring now to FIG. 1, a workpiece processing reactor includes a chamber 100 containing a workpiece support 102. The chamber 100 is enclosed by a side wall 104 and a ceiling 106 formed of a microwave transparent material such as a dielectric material. The ceiling 106 may be implemented as a pair of dielectric windows 108 and 110 shaped as parallel plates. A microwave transmission antenna 114 overlies the pair of dielectric windows 108, 110. The microwave antenna 114 is enclosed by a conductive shield 122 consisting of a cylindrical side wall 124 and a disk-shaped cap 126. In one embodiment depicted in FIG. 2, the microwave transmission antenna 114 is disk-shaped.

As shown in FIG. 1, the microwave transmission antenna 114 is fed by an axial waveguide 116. The axial waveguide 116 is coupled through an overlying rotary microwave coupling 118 to a microwave feed 120. The rotary coupling 118 includes a stationary member 118-1 and a rotatable member 118-2. The stationary member 118-1 is stationary relative to the chamber 100 and is connected to the microwave feed 120. The rotatable member 118-2 is connected to the axial waveguide 116 and has an axis of rotation coinciding with the axis of symmetry 114a of the microwave antenna 114. The rotary microwave coupling 118 permits microwave energy to flow from the stationary member 118-1 to the rotatable member 118-2 with negligible loss or leakage. As one possible example, a slip-ring RF seal (not shown) may be placed at the interface between the stationary and rotatable members 118-1 and 118-2.

A rotation actuator 140 is stationary relative to the chamber 100 and includes a rotation motor 140-1 and a rotating drive gear 140-2 driven by the rotation motor 140-1. A driven gear 118-3 bonded or fastened to the rotatable member 118-2 is engaged with the drive gear 140-2, so that the motor 140-1 causes rotation of the rotatable member 118-2 about the axis of symmetry 114a. The driven gear 118-3 may be implemented, for example, as a circular array of teeth on the bottom surface of the rotatable member 118-2.

Figure 2:
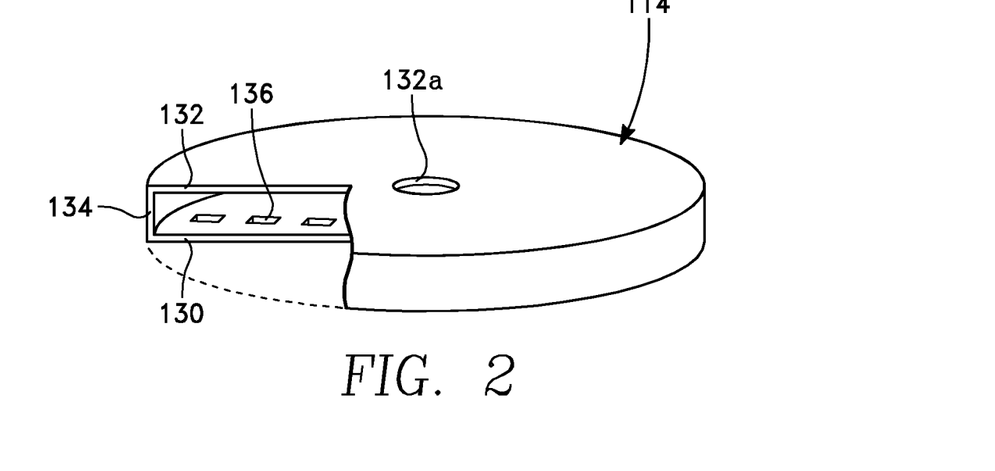
FIG. 2 is a partially cut-away perspective view of a microwave antenna in the embodiment of FIG. 1.
Figure 2A:
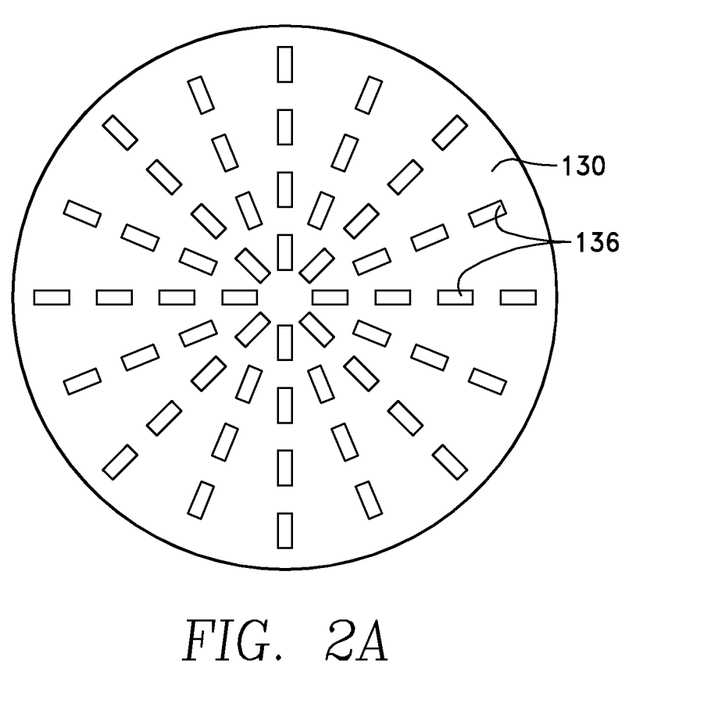
FIG. 2A is a bottom view corresponding to FIG. 2.

In the embodiment of FIGS. 1 and 2, the microwave antenna 114 is a hollow conductive waveguide including a disk-shaped floor 130, a disk-shaped ceiling 132 and a cylindrical side wall 134. The floor 130 faces the ceiling 106 and has an array of slots 136, best seen in FIG. 2A, affecting the antenna radiation pattern. The ceiling 132 includes a central opening 132a into which the axial waveguide 116 extends. The spacing between slots may be selected as a function of the wavelength of the microwave power fed to the microwave antenna 114, and the slot pattern and shape may not necessarily conform with the pattern depicted in FIG. 2A.

Figure 3:
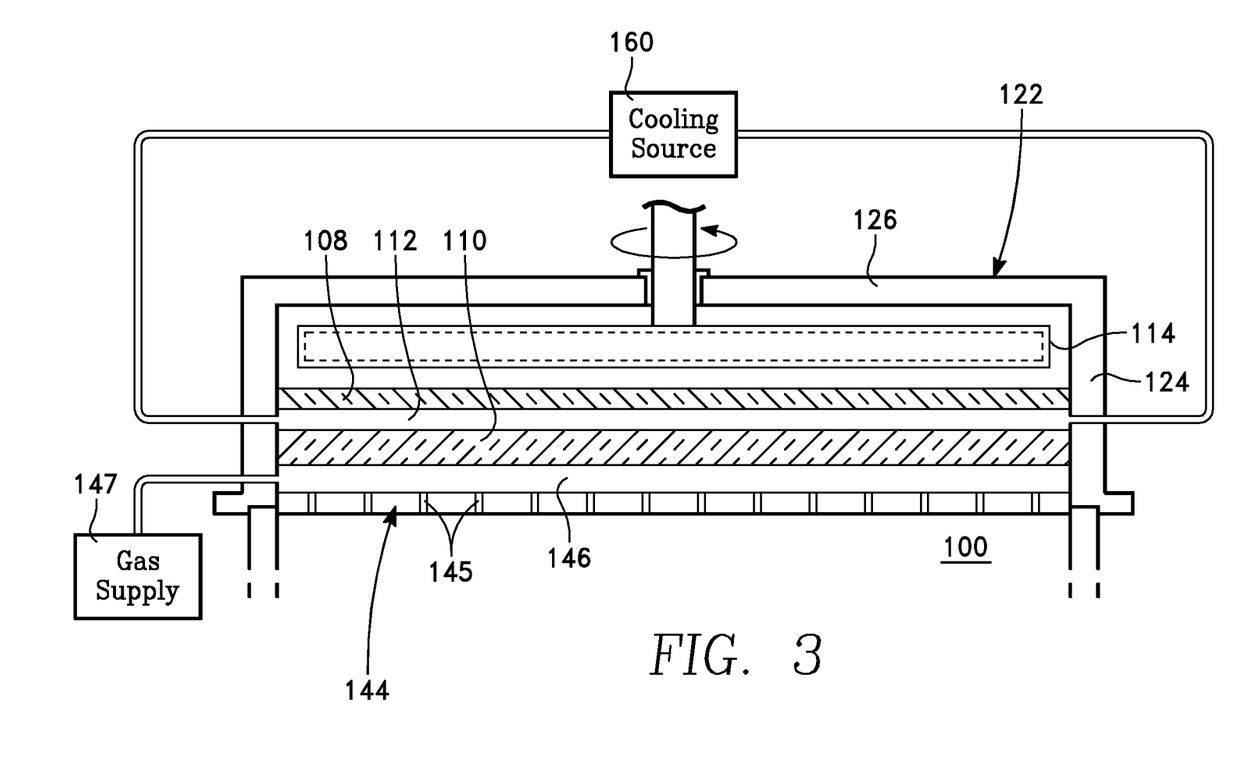
FIG. 3 is a cut-away elevational view of a first modification of the embodiment of FIG. 1.
Figure 4:
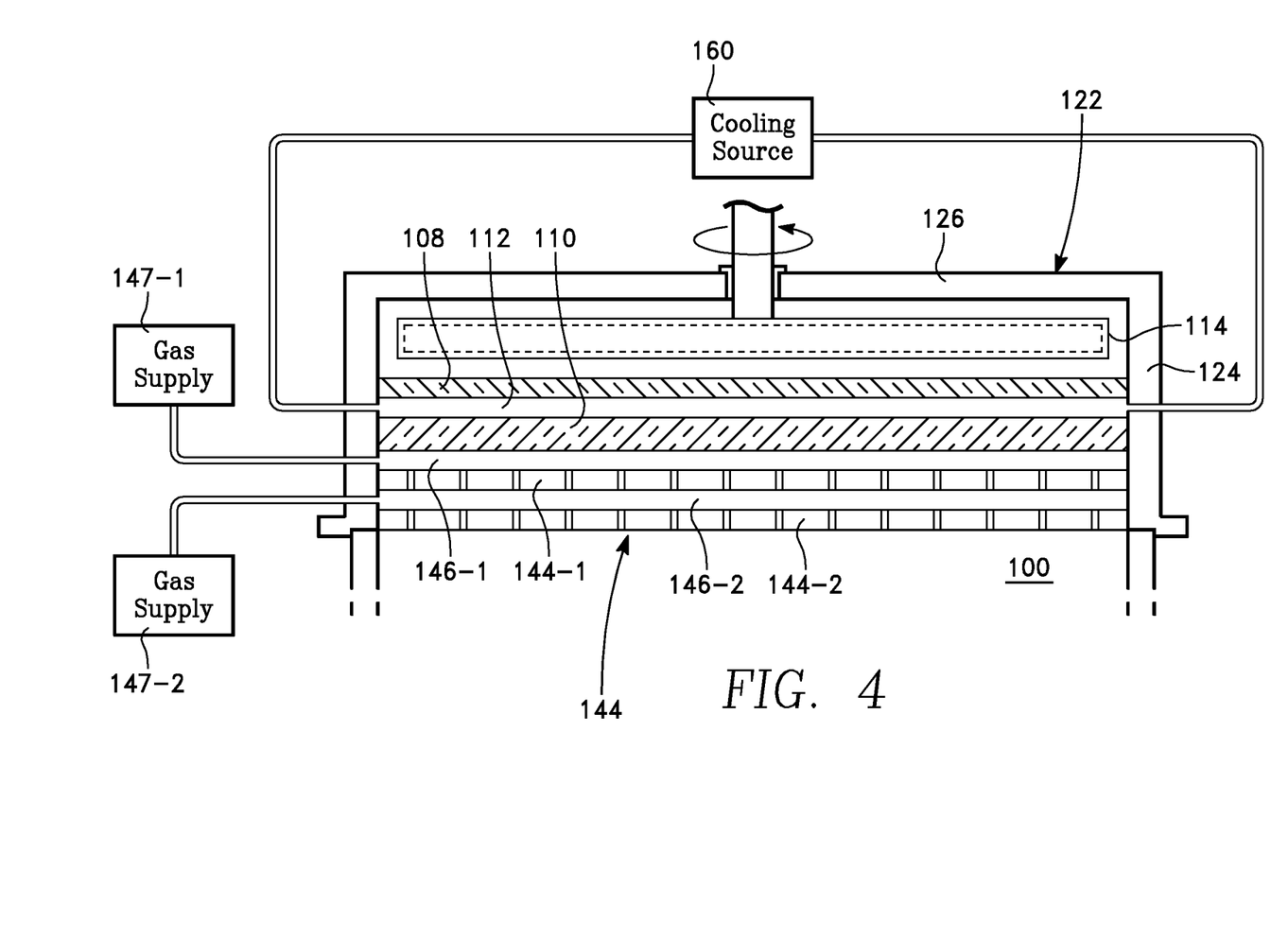
FIG. 4 is a cut-away elevational view of a second modification of the embodiment of FIG. 1.

In one embodiment depicted in FIGS. 1 and 3, a gas distribution plate (GDP) 144 is disposed beneath the ceiling 106, and has an array of gas injection orifices 145 extending through it to provide a gas flow path to the interior of the chamber 100. A gas supply plenum 146 overlies the GDP 144 and receives process gas from a process gas supply 147. In a further embodiment depicted in FIG. 4, the GDP 144 consists of an upper GDP 144-1 and a lower GDP 144-2 fed with respective process gases by respective upper and lower gas supply plenums 146-1 and 146-2 that receive process gases from respective upper and lower gas supplies 147-1 and 147-2. For example, the upper gas supply 147-1 may furnish a non-reactive or inert gas, while the lower gas supply 147-2 may furnish a reactive process gas (such as a fluorine-containing gas).

Figure 5:
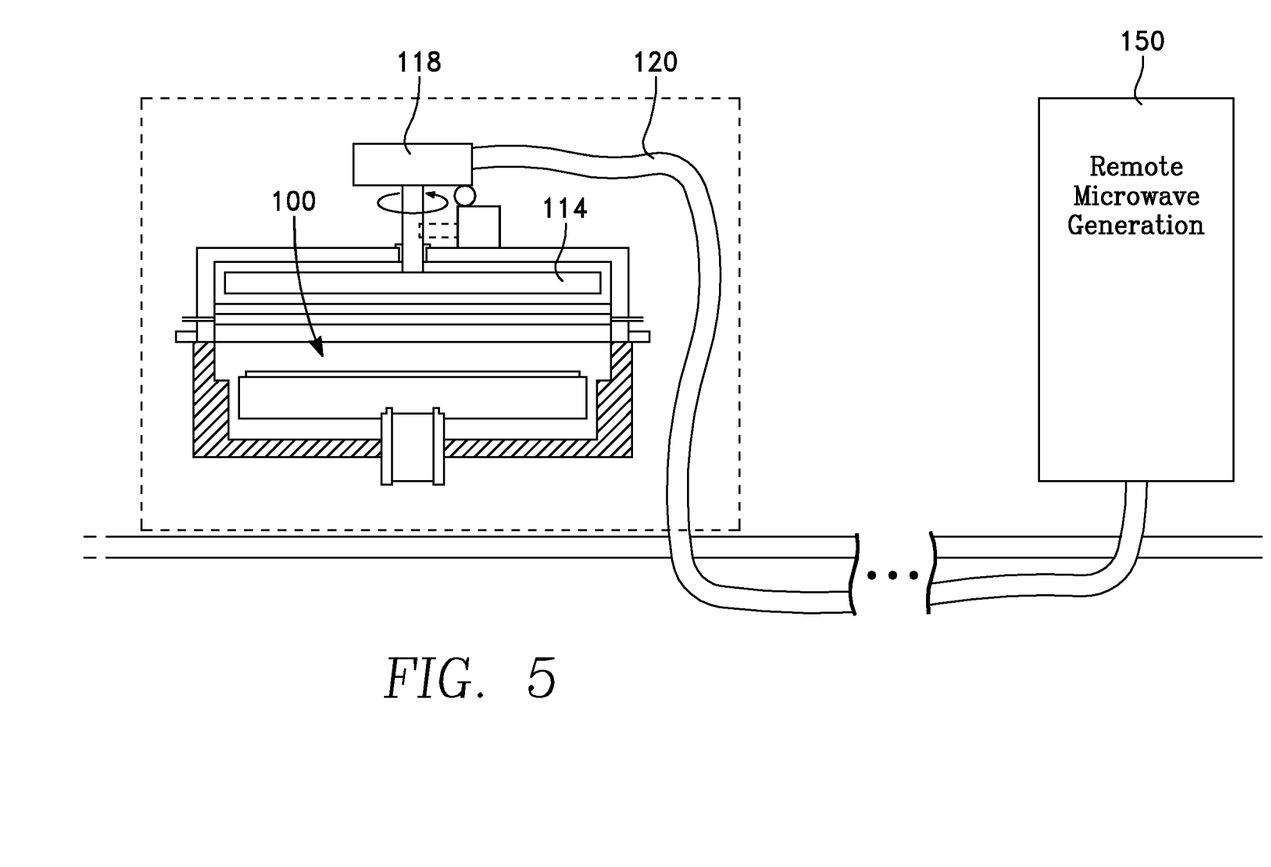
FIG. 5 is a partially cut-away elevational view of a second embodiment.

As shown in FIG. 5, a remote microwave generator 150 is coupled to the rotary coupling 118 by the microwave feed 120. In the embodiment of FIG. 5, the microwave feed 120 is in the form of a long flexible waveguide. The microwave feed 120 may be of sufficient length to accommodate a separation between the remote microwave generator 150 and the chamber 100 of several meters or more, for example. Such a separation between the chamber 100 and the microwave generator 150 permits the microwave generator 150 to be of a large size for high power without affecting the size or footprint of the chamber 100. The flexible waveguide 120 may be of a commercially available type formed of corrugated metal which enables it to be bent while maintaining its cross-sectional shape and waveguide characteristics.

Thermally Controlled Window:

Referring again to FIG. 1, the ceiling 106 may consist of a pair of dielectric windows 108, 110 generally parallel to one another and enclosing a void or channel 112 between them. The channel 112 lies along a radial plane orthogonal to an axis of symmetry 114a of the microwave transmission antenna. A coolant circulation source 160 pumps a heat exchange medium, such as a liquid or gas coolant, through the channel 112 between the dielectric windows 108 and 110. The coolant circulation source may be a heat exchanger for cooling the heat exchange medium. In one embodiment, the heat exchange medium is a liquid that does not absorb microwave energy. Such a fluid is disclosed in U.S. Pat. No. 5,235,251. In this manner, the microwave windows 108 and 110 are cooled so as to withstand very high microwave power levels. This in turn removes a limitation on microwave power, enabling the use of high microwave power levels to provide high processing rates. For example, in the PECVD formation of DLC films, a very high deposition rate may be realized that shortens the process time to a fraction of currently required process times, using microwave power in the kiloWatt range for continuous wave mode or in the megaWatt range for pulsed mode.

Figure 6:
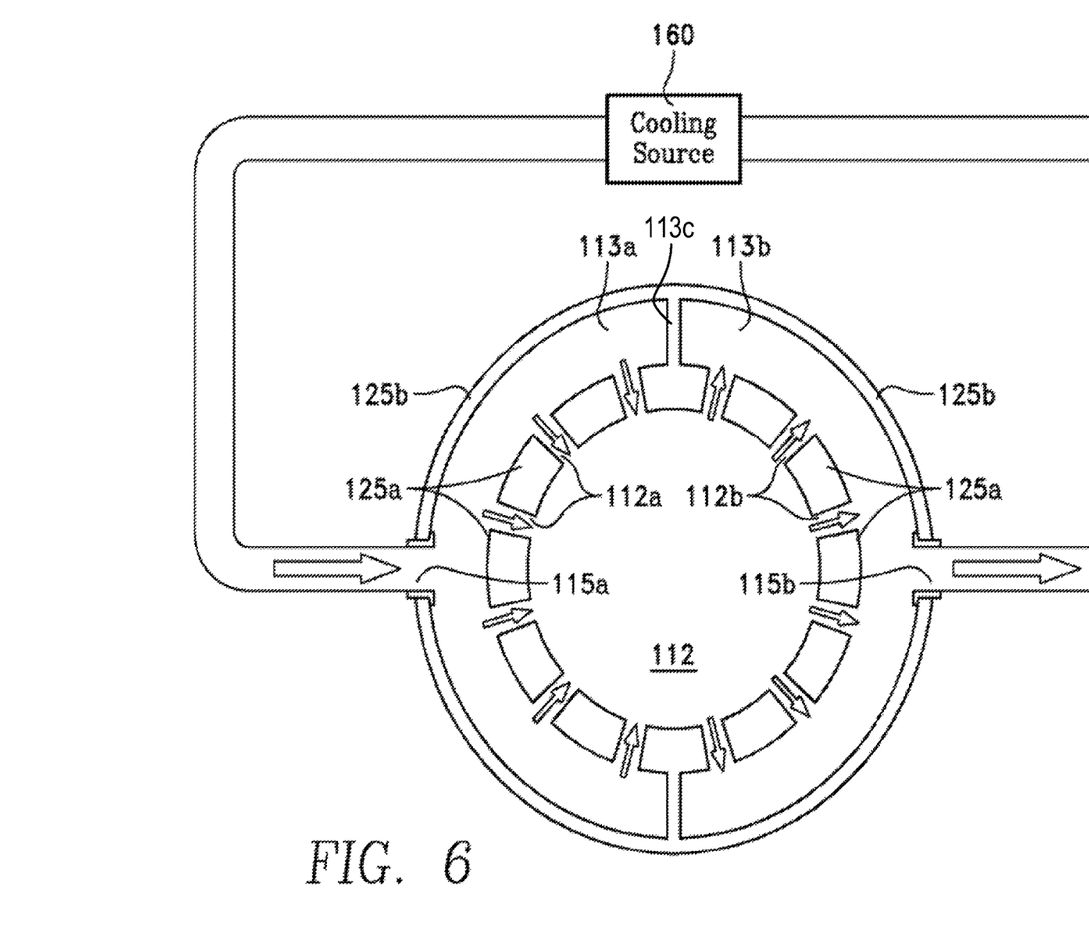
FIG. 6 is partially cut-away top view in accordance with a third embodiment including a temperature controlled microwave window.

Referring to FIG. 6, in one embodiment a half-circular array of radial inlets 112a to the channel 112 are fed by an inlet plenum 113a. The radial inlets 112a are formed through an inner annular barrier 125a. Further, a half-circular array of outlets 112b from the channel 112 are drained by an outlet plenum 113b. The inlet and outlet plenums 113a, 113b are separated by separating wall 113c and are coupled to an output and a return port, respectively, of the coolant circulation source 160 through respective ports 115a, 115b. The respective ports 115a and 115b are formed in an outer annular barrier 125b.

Figure 7:
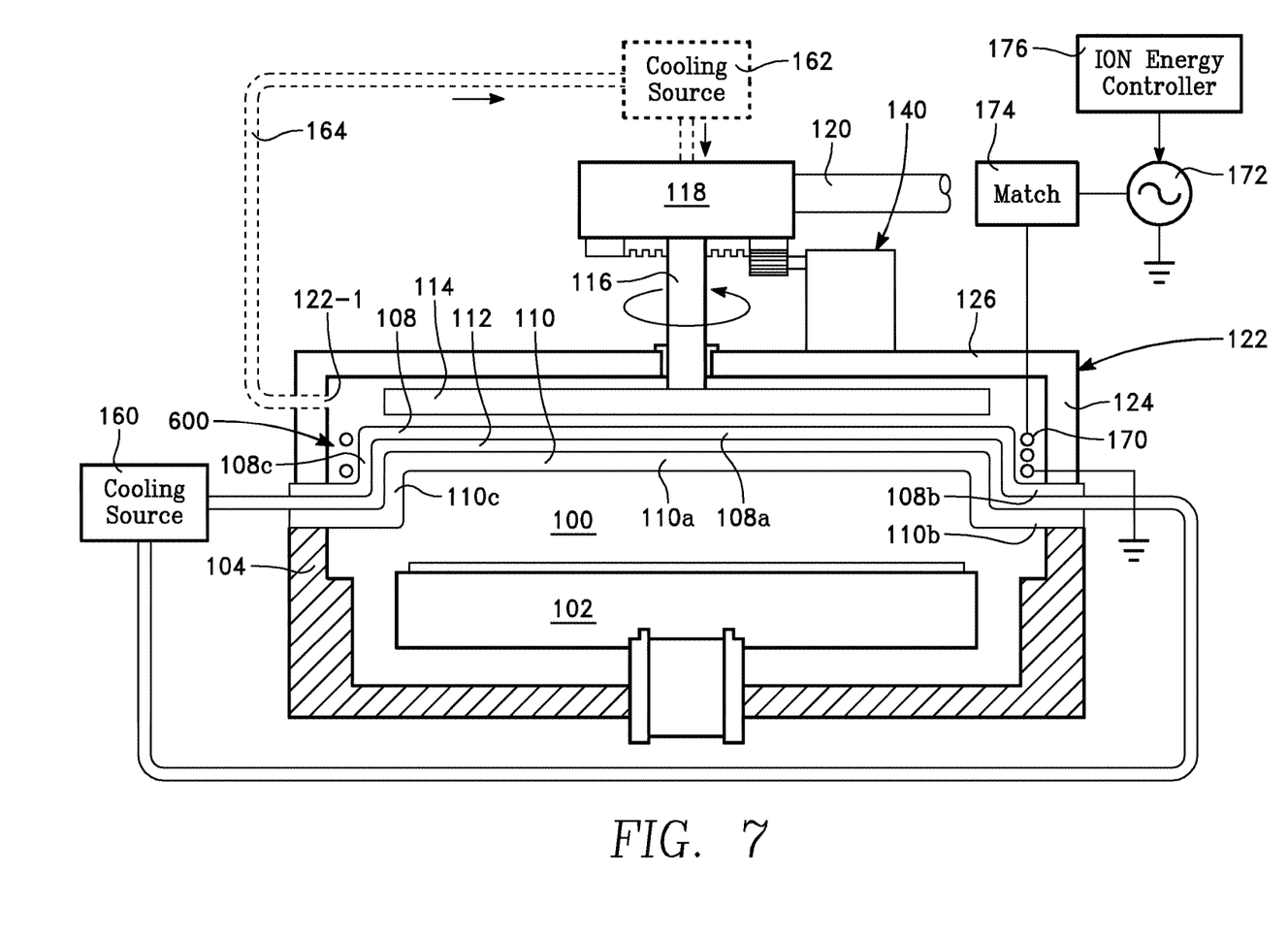
FIG. 7 is partially cut-away elevational view in accordance with a fourth embodiment, including an inductively coupled RF power applicator.

As depicted in dashed line in FIG. 7, in one embodiment a cooling source 162 injects a heat exchange medium such as a cooled gas (cooled air or nitrogen, for example) through the axial waveguide 116 into the interior of the microwave antenna 114. This gas exits the microwave antenna 114 through the waveguide slots 136 (FIGS. 2 and 2A) toward the dielectric window 108. For this purpose, the cooling source 162 is coupled to the interior of the axial waveguide 116 through the rotary coupling 118, for example. A gas return conduit 164 may be coupled to a return port of the cooling source 162 through the shield 122 so as to return the gas to the cooling source for cooling and recirculation. The cooling source 162 may include a refrigeration unit to re-cool the gas received from the gas return conduit.

Microwave Source with Controllable Ion Energy for Lattice Defect Repair During Film Deposition:

During deposition of a film in a PECVD process, the layer being deposited may have some empty atomic lattice sites. As additional layers are deposited, the additional layers cover the empty lattice sites, thus forming voids in the crystalline structure of the deposited material. Such voids are lattice defects and impair the quality of the deposited material. A microwave source such as that employed in the embodiment of FIG. 1 generates a plasma with very low ion energy, so that it does not disturb the lattice structure of the deposited material, including the lattice defects. Such a microwave source may have a frequency of 2.45 GHz, which generates a plasma having a negligible ion energy level. In one embodiment, the problem of lattice defects is solved by supplementing the microwave source with an inductively coupled plasma (ICP) source. Such a combination is depicted in FIG. 7 in which the ICP source is an overhead coil antenna 170. Power is applied from an RF generator 172 through an RF impedance match 174 to the coil antenna 170 during the time that the microwave source generates a plasma perform a PECVD process. The level of RF power from the RF generator 172 is selected to be at a minimum level required to remove (sputter) small amounts of atoms deposited during the PECVD process. The level of RF power from the RF generator 172 may be set slightly above this minimum level. A fraction of such sputtered atoms tend to redeposit in the voids referred to above during the PECVD process. As a result, the formation of lattice defects or voids in the deposited material is prevented. For this purpose, a controller 176 is provided that enables the user (or a process management system) to select an ideal power level of the RF generator 172.

In the embodiment of FIG. 7, each of dielectric windows 108 and 110 has a recessed annulus at its edge to form an annular pocket 600 into which the coil antenna 170 is received below the plane of the microwave antenna 114. For this purpose, the dielectric window 108 has a disk-shaped major portion 108a, an annular recessed edge portion 108b and an axial cylindrical portion 108c joining the major portion 108a and the recessed edge portion 108b. Similarly, the dielectric window 110 has a disk-shaped major portion 110a, an annular recessed edge portion 110b and an axial cylindrical portion 110c joining the major portion 110a and the recessed edge portion 110b. The annular pocket 600 is defined between the axial cylindrical portion 108c and the side wall 124 of the shield 122. The annular pocket 600 is sufficiently deep to hold the entire coil antenna 170 below the plane of the microwave antenna 114.

While the foregoing is directed to embodiments of the present invention, other and further embodiments of the invention may be devised without departing from the basic scope thereof, and the scope thereof is determined by the claims that follow.

What is claimed is:

1. A plasma reactor for processing a workpiece, comprising:
   a chamber and a workpiece support in said chamber, said chamber comprising a ceiling and a side wall, said ceiling comprising a microwave transmissive window having a disk shape;
   a first gas distribution plate overlying said workpiece support and comprising plural gas injection orifices, a process gas plenum overlying said first gas distribution plate and a process gas supply conduit coupled to said process gas plenum;
   a microwave radiator overlying said microwave transmissive window and comprising a cylindrical hollow conductive housing having a top, a side wall and a bottom floor, an array of openings in said bottom floor, and a microwave input port;
   a coolant distribution path extending along a radial plane through said microwave transmissive window, said coolant distribution path comprising a central channel, an arcuate inlet plenum disposed around a first side of the central channel, an arcuate outlet plenum disposed around an opposite second side of the central channel and spaced apart from the arcuate inlet plenum by a separating wall there-between, an arcuate array of radial inlets connecting said arcuate inlet plenum to said central channel, an arcuate array of radial outlets connecting said central channel to said outlet plenum, an inlet port to the inlet plenum, and an outlet port from the outlet plenum, the outlet port positioned opposite the inlet port across the central channel; and a coolant circulator coupled between said inlet port and said outlet port.

2. The plasma reactor of claim 1 further comprising a microwave generator coupled to said microwave input port and having an output power level of 800 kW in continuous wave mode or 1 megaWatt in pulsed mode.

3. The plasma reactor of claim 1 wherein said microwave transmissive window comprises a pair of parallel plates and said coolant distribution path comprises a space between said pair of parallel plates.

4. The plasma reactor of claim 1 further comprising:
a second gas distribution plate underlying said first gas distribution plate and comprising second plural gas injection orifices, an underlying process gas plenum between said first and second gas distribution plates, and a second process gas supply conduit coupled to said underlying process gas plenum.

5. The plasma reactor of claim 1 further comprising a coolant medium supply coupled to an interior of said microwave radiator.

6. The plasma reactor of claim 5 wherein said coolant medium supply is coupled to said microwave input port of said microwave radiator.

7. The plasma reactor of claim 1 further comprising:
a rotary waveguide coupling comprising:
(A) a stationary member fixed with respect to said chamber and comprising a microwave power receiving port, and
(B) a rotatable member coupled to said microwave input port of said microwave radiator and having an axis of rotation coincident with an axis of symmetry of said cylindrical hollow conductive housing; and,
a rotation actuator coupled to said rotatable member, whereby said microwave radiator is rotatable by said rotation actuator about said axis of symmetry.

8. The plasma reactor of claim 7 wherein:
said rotation actuator comprises a motor and a rotatable drive gear coupled to said motor;
said rotatable member comprises a driven gear fastened to said rotatable member and engaged with said rotatable drive gear.

9. The plasma reactor of claim 8 wherein said rotatable drive gear is at a stationary location and is rotatable about a radial axis, and said driven gear is at a location fixed relative to said rotatable member.

10. The plasma reactor of claim 7 further comprising an axial waveguide connected between said microwave input port of said microwave radiator and said rotatable member.

11. The plasma reactor of claim 10 wherein said axial waveguide is coaxial with said axis of symmetry.

12. The plasma reactor of claim 7 further comprising a microwave generator and a flexible waveguide conduit connected between said microwave generator and said microwave power receiving port of said stationary member.

13. The plasma reactor of claim 7 wherein said microwave radiator is capable of radiating at frequency not less than 2.45 GHz.

14. The plasma reactor of claim 7 wherein said array of openings in said bottom floor of said microwave radiator has a periodic spacing corresponding to a predetermined fraction of a microwave wavelength.

15. The plasma reactor of claim 14 wherein said microwave radiator has a radiation pattern with a periodic non-uniformity corresponding to said spacing, which is averaged out by rotation of said microwave radiator.

16. The plasma reactor of claim 1 further comprising:
an annular pocket formed in said microwave transmissive window;
an inductive coil antenna in said annular pocket;
a source of RF power coupled to said inductive coil antenna; and
a controller coupled to said source of RF power.

17. The plasma reactor of claim 1 wherein said inlet plenum and said outlet plenum each provide half of a circular annulus around the central channel.

18. The plasma reactor of claim 17 wherein the central channel is circular.

19. The plasma reactor of claim 1 wherein said microwave transmissive window comprises a dielectric material and said coolant distribution path comprises a passage in said dielectric material.

* * * * *